United States Patent [19]

Tamura et al.

[11] 4,325,995
[45] Apr. 20, 1982

[54] METHOD AND AN APPARATUS FOR THIN FILM FORMATION

[75] Inventors: Yoshitaka Tamura; Shizuo Ishitani; Takashi Shigemura, all of Mobara, Japan

[73] Assignee: Hitachi, Ltd., Tokyo, Japan

[21] Appl. No.: 154,997

[22] Filed: May 30, 1980

[30] Foreign Application Priority Data

Jun. 6, 1979 [JP] Japan .................. 54/69895

[51] Int. Cl.³ .............................................. B05D 1/28
[52] U.S. Cl. ................................... 427/428; 101/363; 101/350; 101/339; 101/340; 118/240; 118/242; 118/262
[58] Field of Search ............... 101/363, 350, 339, 340, 101/343, 344, 345, 346, 312; 118/240, 241, 242, 243, 261, 262, 200; 427/428

[56] References Cited

U.S. PATENT DOCUMENTS 2,538,945  1/1951  Mortell ................ 118/242
3,283,712 11/1966  Chambon .............. 118/262 X
4,211,167  7/1980  Corse .................. 101/363 X

FOREIGN PATENT DOCUMENTS 53-5689  3/1978  Japan .

Primary Examiner—Shrive P. Beck
Attorney, Agent, or Firm—Craig and Antonelli

[57] ABSTRACT

A method and an apparatus for thin film formation using off-set printing techniques, wherein a film-forming material is coated uniformly on a platform, which material is then transferred onto an object on which a thin film is to be formed. Coating the material on the platform is carried out by moving on the platform a roll coater which includes a distributing roller and a coating roller and which feeds the film-forming material onto the platform and by rotating the coating roller in a direction at which slippage in engagement between the coating roller and the platform is always involved in relation with the movement of the roll coater.

4 Claims, 7 Drawing Figures

METHOD AND AN APPARATUS FOR THIN FILM FORMATION

This invention relates to a method and an apparatus for thin film formation, in more particular to such a method and an apparatus that can provide a uniform thin film on an object with high precision but without pinholes by the use of off-set printing techniques.

The prior art and the present invention and the advantages of the latter will be described with reference to the accompanying drawings, in which.

In forming a thin film with thickness of approximately $2\pm0.3\mu$ (microns) at the time of coating and $600\pm100$ Å at its dried state on, for example, a glass plate by means of off-set printing techniques utilizing a conventional roll coating system, it is difficult to obtain a desirable thin film uniform in thickness and free of pinholes, although such difficulty is in dependence on the physical properties, such as viscosity and thixotropy, of a film-forming material (hereafter referred to as ink).

Figure 1:
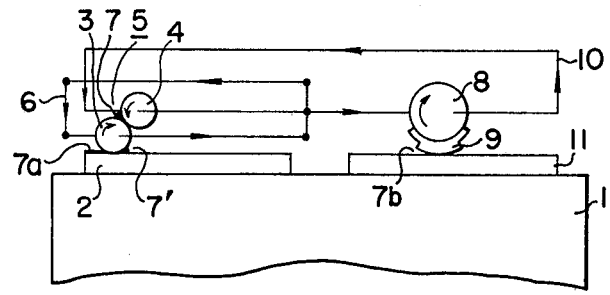
FIG. 1 is a diagram for explaining a conventional roll coating system for off-set printing.
Figure 2:
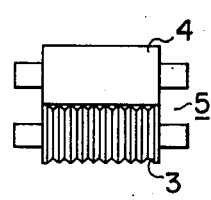
FIG. 2 is an enlarged front view of a roll coater of the roll coating system shown in FIG. 1.

Reference is now made to FIG. 1 to describe a method of thin film formation on an object such as a glass plate, utilizing a conventional roll coating system. In this Figure, ink 7 is fed to and coated from left to right on an inking platform 2 mounted on an off-set printing machine base 1, as a roll coater 5 moves along a path 6. The roll coater 5 comprises a coating roller 3 at least the surface of which is made of an elastic material such as rubber and a distributing roller 4. The roll coater 5 usually employs a gravure roller (machine engraved roller) as the coating roller 3, as shown in FIG. 2. In this conventional roll coating system, the coating roller 3 rotates in the clockwise direction as the roller coater 5 moves from left to right to coat the inking platform with ink. Such a rotation of the coating roller 3 as above, which may be said to be a rotation in a forward direction in relation to the motion of the roll coater 5 will be hereafter called a forward rotation. The ink coated on the inking platform 2 is taken up by a printing plate 9 which is usually made of rubber and is mounted on the outer surface of a blanket cylinder 8 as the blanket cylinder 8 moves along the path 10. The taken-up ink is then transferred onto an object 11 such as a glass plate, thereby coating the object 11 with ink 7b. A film of this ink 7b, when dried, form a thin film on the object 11.

According to such a thin film formation method as mentioned above, the ink 7a on the inking platform 2 is not evenly taken away by the printing plate 9 at times, and then the platform is left with uneven deposition of ink. If an amount of ink is then further fed to the inking platform 2 by the roll coater 5, there will be formed puddles of ink along the contact portion of the coating roller 3 with the inking platform 2. Thus, the thickness or distribution of the ink 7a on the inking platform 2 will become non-uniform. Moreover, since the coating roller 3 undergoes a forward rotation while feeding ink 7 to the inking platform 2, bubbles may be formed in the ink 7a on the platform 2 unless the ink is of a kind having appropriate physical properties. If such an uneven coat of ink 7a containing bubbles is transferred from the inking platform 2 to the object 11 by means of the printing plate 9, the ink coated on the object 11 forms a film which is non-uniform in thickness and has pinholes.

The thickness of the ink 7a coated on the inking platform 2 is adjusted by controlling the rotational speed of the coating roller 3, the speed of the coater 5, and the pressure between the coating roller 3 and the distributing roller 4. In the roll coating system mentioned above, the coating roller 3 rotates in the forward direction, so that the ink behind the coating roller 3 does not necessarily have the thickness as intended by the control of the rotational speed of the coating roller 3 and the speed of the roll coater 5, and hence an accurate thickness control of the ink coat is not attainable. Since the thickness of the ink coated on the object 11 through the printing plate 9 depends on that of the ink on the printing platform 2, the above inaccuracy in the thickness control results in an inaccuracy in the film thickness on the object 11.

Figure 3:
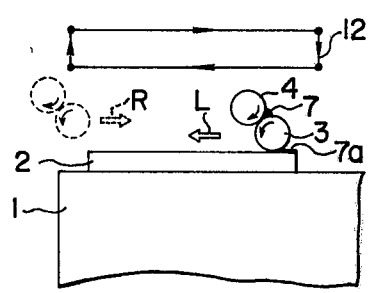
FIG. 3 illustrates another form of a conventional roll coating system for off-set printing.

FIG. 3 shows another form of a conventional roll coating system, in which a path 12 indicating forward and backward movements, indicated by L and R, respectively, of the roll coater 5 is opposite to the path 10 of the blanket cylinder 8. However, since the rotational directions of the coating roller 3 and the distributing roller 4 are also each opposite to those as shown in FIG. 1, ink-coating conditions on the inking platform 2 are the same as in the case of the above-described roll coating system. Accordingly, this system has the same disadvantages as above.

An object of this invention is to remove these disadvantages and to provide a method and an apparatus for forming thin films having uniform and precise thickness without pinholes therein.

In order to attain this object, according to the invention, the coating roller 3 is rotated in the reverse direction in relation with the motion of the roll coater 5, i.e. rotated counter-clockwise in the movement of the roll coater 5 from the left to the right shown in FIG. 1, so that, while scraping by the reverse rotation of the coating roller 3 the remainder of ink remaining on the inking platform 2 after ink transference by the printing plate 9, further ink coating onto the inking platform 2 is effected by the coating roller 3 in the state of its reverse rotation. Such a reverse or counter-clockwise rotation of the coating roller can be defined as that which always involves slippage in engagement between the coating roller 3 and the inking platform 2.

According to one aspect of the invention there is provided a method for thin film formation comprising the steps of: feeding a film-forming material onto a platform by means of a roll coater including a distributing roller and a coating roller, said coating roller being adapted to be in contact with the distributing roller under pressure and with the platform; coating the material on the platform in a substantially uniform thickness by moving the roll coater on the platform and by rotating the coating roller in a direction at which slippage in engagement between the coating roller and the platform is always involved in relation with the movement of the roll coater; and transferring the film-forming material coated on the platform onto an object on which a thin film is to be formed, thereby forming a film of the film-forming material on the object.

According to another aspect of the invention there is provided an apparatus for thin film formation comprising: a platform on which a film-forming material is coated in a uniform thickness; a roll coater including a distributing roller and a coating roller which are adapted to be in contact with each other under pressure, the roll coater being moved on the platform while coating the material on the platform, the coating roller being adapted to be in contact with the platform and being rotated in a direction at which slippage in engagement between the coating roller and the platform is always involved in relation with the movement of the roll coater; and means for transferring the material coated on the platform onto an object on which a thin film is to be formed.

A technique of rotating a coating roller in such a reverse direction in relation with the direction of the relative movement of the roller to an inking board which corresponds to the above inking platform 2 of the invention, is disclosed in, for example, Japanese Patent Publication No. 5689/78. However, the reverse rotation of the roller as disclosed is adopted to attain a uniform coat of ink but not to remove or scrape excessive ink on the inking board. Also, it is not described in the Patent Publication to effect ink coating by the reverse rotation of the roller.

Figure 4:
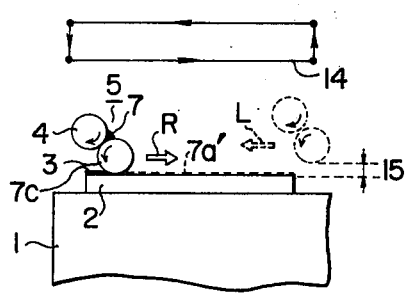
FIG. 4 illustrates an embodiment of this invention.
Figure 5:
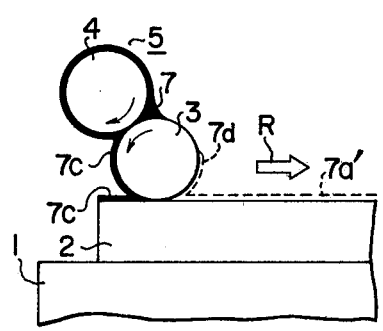
FIG. 5 is a diagram for showing a portion of FIG. 4 on an enlarged scale.
Figure 6:
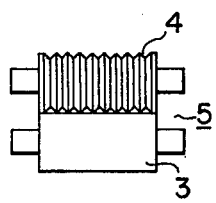
FIG. 6 is a front view of a roll coater used in the embodiment of FIG. 4.

Referring now to FIGS. 4, 5, and 6, an embodiment of the present invention will be described below. FIG. 4 illustrates a roll coating system according to the invention. FIG. 5 shows, on an enlarged scale, a portion of the roll coating system shown in FIG. 4, including a roll coater. In these Figures, members indicated by the same reference numerals are the same as in FIG. 1. The roll coater 5 feeds ink onto the inking platform 2 as it moves along a path 14 in the direction indicated by an arrow R. During this ink feeding period, the coating roller 3 is maintained in contact with the inking platform 2 and rotated in the reverse direction, i.e. rotated counter-clockwise in relation with the direction indicated by the arrow R. When such ink feeding has been done, the roll coater 5 is lifted up and returned back to a starting position along the path 14 in the direction indicated by an arrow L, keeping a distance 15 above the inking platform.

According to this embodiment, the ink 7a' fed onto the inking platform 2 previously but not transferred by the printing plate 9 and hence remaining on the inking platform 2 is scraped off the platform 2 by the coating roller 3 rotating in the reverse direction, to be recollected on the coating roller 3 as indicated at 7d and into ink puddle 7, so that ink 7c newly fed by the coating roller 3 may be coated uniformly on the inking platform 2. Furthermore, since the ink 7c is coated by the coating roller in its reverse rotation, no bubbles will be formed in the coating ink on the inking platform 2, resulting in no pinholes in the ink 7b coated on the object 11 by the printing plate 9.

Also, according to this embodiment, the reverse rotation of the coating roller 3 enables the roll coater 5 to accurately control the thickness of the ink 7c behind the coating roller 3 by adjusting the rotational speed of the coating roller and the moving speed of the roll coater 5, in accordance with the pressure between the coating roller 3 and the distributing roller 4. Thus, a high precision in coating thickness of the ink 7b on the object 11 can be attained.

When a gravure roller is used for the coating roller 3, there happens that ink will be coated on the platform 2 in a pattern of stripes in dependence on the physical properties such as viscosity and thixotropy of the ink. For eliminating such stripe pattern and obtaining a good coating condition of ink, the constructions of the coating roller 3 and the distributing roller 4 should be exchanged, or a gravure roller should be used for the distributing roller 4 and the coating roller 3 is made to have a smooth elastic surface, as shown in FIG. 6. Since, further, it is difficult to make the gravure roller of rubber with a high precision, the use of such a rubber gravure roller may result in non-uniform contact between the rollers 3 and 4 along the axial direction, which non-uniform contact in turn causes an uneven deposition of ink on the platform 2. A metallic gravure roller can be made with high precision and the use of such a metallic gravure roller can avoid such an uneven deposition of ink.

Figure 7:
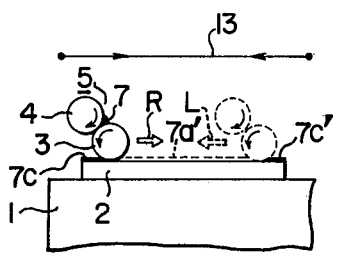
FIG. 7 is an illustration showing a method for forming a thin film tried by the inventors.

The inventors have tried and tested a method of coating the inking platform 2 with ink 7 in which the coating roller 3 is kept in contact with the inking platform 2 during the return trip of the roller coater 5 back to its starting position, as shown in FIG. 7, so that ink 7c' is deposited on the inking platform 2 in such a trip. The roll coater 5 then moves along the path 13. It was found that, although a uniform thickness of ink on the inking platform 2 can be attained due to the reverse rotation of the coating roller 3 scraping the remaining ink 7a' and thereafter redistributing ink 7c and 7c', prevention of bubble formation and accurate thickness control of the coated ink cannot be attained in this method since coating conditions for the roll coater 5 on its way indicated by an arrow L are the same as in the case shown in FIG. 1.

What we claim is:
1. In a method for thin film formation comprising the steps of:
   feeding a film-forming material onto a platform with a roll coater including a distributing roller and a coating roller, said coating roller being adapted to be in contact with the distributing roller under pressure and with the platform;
   coating said material on the platform by rotating the coating roller and by moving the roller coater over the platform; and
   transferring the material coated on the platform onto an object on which a thin film is to be formed, thereby forming a film of said material on said object;
   the improvement which comprises rotating said coating roller in a reverse direction with respect to the direction of movement of the roll coater over said platform thereby scraping the material coated previously and remaining on the platform after the transferring step by the reverse rotation of said coating roller and collecting the scraped material in a puddle of said material formed between the distributing roller and the coating roller, the scraping and collecting steps being effected simultaneously with the coating step whereby said film forming material is coated in a uniform thickness on said platform.

2. A method according to claim 1, wherein said film-forming material is ink and is transferred from the platform onto a glass plate.

3. In an apparatus for thin film formation comprising:
a platform on which a film-forming material is coated;
a roll coater including a distributing roller and a coating roller which are adapted to be in contact with each other under pressure, said roll coater being moved over the platform during coating of the material on the platform by rotation of the coating roller, said coating roller being adapted to be in contact with the platform; and
means for transferring the material coated on the platform onto an object on which a thin film is to be formed;
the improvement which comprises a coating roller that rotates in a reverse direction with respect to the direction of movement of the roll coater over said platform thereby causing the coating roller to scrape material coated previously and remaining on the platform after the transfer of material and to collect the scraped material in a puddle formed between the distributing roller and the coating roller, whereby said coating roller forms a uniform thickness of said film-forming material on said platform.

4. An apparatus according to claim 3, wherein said distributing roller is a metallic gravure roller, and said coating roller has a smooth elastic surface.

* * * * *